United States Patent [19]

Kerkow et al.

[11] Patent Number: 5,121,063
[45] Date of Patent: Jun. 9, 1992

[54] ARRANGEMENT FOR DETERMINING ON APPROXIMATION THE EQUIVALENT CIRCUIT DIAGRAM OF AN ELECTRICAL OR ELECTRONIC ELEMENT AT HIGH FREQUENCIES

[75] Inventors: Jörg M. Kerkow, Langenfeld; Heinrich Pryschelski, Eschweiler, both of Fed. Rep. of Germany

[73] Assignee: U.S. Philips Corp., New York, N.Y.

[21] Appl. No.: 752,194

[22] Filed: Aug. 20, 1991

Related U.S. Application Data

[63] Continuation of Ser. No. 362,533, Jun. 7, 1989, abandoned.

[30] Foreign Application Priority Data

Jun. 25, 1988 [DE] Fed. Rep. of Germany ....... 3821575

[51] Int. Cl.⁵ .......................................... G01R 27/28
[52] U.S. Cl. .................................. 324/601; 324/638; 324/650; 364/571.05; 364/802
[58] Field of Search .................. 364/571.01, 571.05, 364/571.04, 571.02, 802; 324/601, 650, 638

[56] References Cited

U.S. PATENT DOCUMENTS

| | | | |
|---|---|---|---|
| 3,044,703 | 7/1962 | Paynter | 364/802 |
| 3,500,184 | 3/1970 | Ho | 364/802 |
| 3,775,603 | 11/1973 | Ainsworth | 364/802 |
| 4,342,089 | 7/1982 | Hall | 364/571.05 |
| 4,816,767 | 3/1989 | Cannon | 364/571.04 |
| 4,835,726 | 5/1989 | Lewis | 364/802 |
| 4,858,160 | 8/1989 | Strid | 364/571.01 |

OTHER PUBLICATIONS

Rhytting: "An Analysis of Vector Measurement Accuracy Enhancement Techniques"—RF & μW Symposium—Mar. 1982.

IEEE Transactions on Microwave Theory and Techniques, Band MTT-30, J. C. Tippet et al, 1982, "A Rigorous Technique for Measuring the Scattering Matrix . . . ".

Microwave Journal, Band 24, Nr. 4, Apr. 1981, G. R. Cobb: "New Software for Low Loss Two-Part Measurements".

*Primary Examiner*—Kenneth A. Wieder
*Assistant Examiner*—Jose M. Solis
*Attorney, Agent, or Firm*—Lesley A. Rhyne

[57] ABSTRACT

An arrangement for determining on approximation the equivalent circuit diagram of an electrical or electronic element at high frequencies includes a measuring apparatus (4), to which the element to be represented as a two-port element (59) or a one-port element (1) is connected through connection members (2; 57, 58, 60) and which measures over a preselected frequency range the parameters of the stray matrix of the two-port element of the impedance or the reflection factor of the one-port element with the connection members. To the measuring apparatus (4) is connected an evaluation circuit (7), which corrects the measurement result by inclusion of two-port parameters of the connection member(s) determined before the measurement and which calculates for a preselected equivalent circuit diagram of the element from the corrected measurement result values of the equivalent circuit diagram elements by means of an optimization strategy.

8 Claims, 2 Drawing Sheets

ARRANGEMENT FOR DETERMINING ON APPROXIMATION THE EQUIVALENT CIRCUIT DIAGRAM OF AN ELECTRICAL OR ELECTRONIC ELEMENT AT HIGH FREQUENCIES

This is a continuation of application Ser. No. 07/362,533 filed Jun. 7, 1989, now abandoned.

BACKGROUND OF THE INVENTION

1. Field of the Invention

The invention relates to an arrangement for determining on approximation the equivalent circuit diagram of an electrical or electronic element at high frequencies by means of a measuring apparatus, to which the element representing a two-port or one-port element is connected through connection members and which measures the parameters of the stray matrix of the two-port element or the impedance or the reflection factor of the one-port element with the connection members over a preselected frequency range.

2. Description of the Prior Art

Electrical or electronic elements used in the circuits, in which signals having frequencies of more than 10 MHz are processed, have not only the property (for example resistance, inductance, capacitance, amplification etc.) characterizing them, but also parasitic properties. For example, a capacitor has besides its desired capacitance also at least an inductive (parasitic inductance) and an ohmic component (parasitic resistance). A transistor, which has to amplify a signal, for example has a at least a capacitive (parasitic capacitance), an inductive (parasitic inductance) and an ohmic component (parasitic resistance). In order to correctly dimension the circuit, in which the element is used, it is required to know its parasitic properties. For measuring the impedance or the reflection factor of a one-port element, such as, for example, inter alia a resistor and a coil, a measuring apparatus (network analyser) is used, which is known, for example, from GB A 2154752. During measurement, a high-frequency signal is supplied to the one-port element. The reflection factor or the impedance is determined from the reflected signal. Such a measuring apparatus is provided also for measuring the stray matrix of two-port elements, for example, inter alia transistors and band-pass filters. The one-port and two-port elements are connected to one and two standard connections (N connectors), respectively, of the measuring apparatus through connection members. Such connection members falsify the measurement result by parasitic effects originating from them. Such a measuring apparatus does not determine an equivalent circuit diagram either of the one-port or two-port element, but it measures over a preselected frequency range the real and imaginary parts or the amplitude and phase of the impedance or of the reflection factor of a one-port element or the parameters of the stray matrix of a two-port element.

SUMMARY OF THE INVENTION

The invention therefore has for its object to provide an arrangement for determining on approximation the equivalent circuit diagram of an element at high frequencies, which eliminates the influence of the connection members when determining the values of the equivalent circuit diagram elements.

This object is achieved in an arrangement of the kind mentioned in the opening paragraph in that an evaluation circuit connected to the measuring apparatus is provided, which corrects the measurement result by inclusion of two-port parameters determined before the measurement of the connection member (members)

calculates for an equivalent circuit diagram of the element from the corrected measurement result values of the equivalent circuit diagram elements by an optimization strategy.

The evaluation circuit used in the arrangement according to the invention, which is connected to the measuring apparatus, may be, for example, a microprocessor circuit. Before the measurement of the impedance or of the reflection factor of a one-port element or of the parameters of a stray matrix of a two-port element, two-port parameters of the connection member or members have been stored in the evaluation circuit for each frequency location of the preselected frequency range. Such two-port parameters may be, for example, an impedance matrix, an admittance matrix, a chain matrix, a stray matrix or another matrix describing the connection member. The two-port parameters of the connection member at each frequency location can be known and can be read into the evaluation circuit before the measurement or can be determined by premeasurements before the actual measurement.

After the actual measurement, the measurement result is corrected. The falsification of the measurement result caused by the connection member or members is eliminated. After determination of the corrected measurement result, the values of the equivalent circuit diagram elements are calculated for an equivalent circuit diagram. The equivalent circuit diagram can be indicated before the measurement or the evaluation circuit can determine the suitable equivalent circuit diagram among several equivalent circuit diagrams.

The calculation is then effected by means of an optimization strategy. From initial values for a one-port element, the impedance or the reflection factor, or for a two-port element the stray matrix for a number of frequency locations over the preselected frequency range are determined. By means of an error function, the evaluation circuit determine a deviation between the calculated result and the measurement result and changes the initial values so that the deviation is reduced. As error function F, the following equation, which brings about an averaging of the quadratic errors, can be used:

$$F = \left[ \frac{\sum_{i=1}^{m} \left[ \frac{y(fi) - x(fi)}{x(fi)} \right]^2}{m} \right]^{\frac{1}{2}} \quad (1)$$

where x(fi) is the measurement result, y(fi) is the calculated result at the frequency location fi and m is the number of frequency locations. As optimization strategies, for example, inter alia gradient methods and coordinate searching methods may be used. In this respect, further data can be derived from the book "Optimierungsverfahren" by W. Entenmenn, Dr. Alfred Hüthig-Verlag Heidelberg, UTB-Taschenbuch 539, 1976.

In a further embodiment of the invention, it is ensured that the evaluation circuit calculates from the measured impedance of the one-port element by means of the connection member and the parameters of the admittance matrix of the connection member the impedance of the one-port element for each preselected frequency location, while for each frequency location parameters of the admittance matrix before the actual measurement have been determined by a shortcircuit measurement, a no-load measurement and a measurement with a standard resistor. The impedance Zd of the one-port element at each frequency location is calculated by the evaluation circuit according to the following equation from the admittance matrix Y of the connection member and the impedance Zm of the one-port element with the connection member $$Zd = \frac{1 - y Zm}{Zm \, det(Y) - Y22} \quad (2)$$

where y11 and y22 are parameters and det(Y) is the determinant of the admittance matrix Y at a frequency location. The admittance matrix can be determined before the actual measurement in that three measurements, i.e. a shortcircuit measurement, a no-load measurement and a termination measurement, with a standard resistor (for example 50Ω) are carried out.

In another embodiment of the invention, it is ensured that the evaluation circuit calculates from the measured stray matrix of the two-port element with the connection members and the parameters of the admittance matrix of each connection member the parameters of the admittance matrix of the two-port element for each preselected frequency location, while for each frequency location parameters of the admittance matrix of each connection member are determined before the actual measurement by a short-circuit measurement, a no-load measurement and a measurement with a standard resistor. In this case, by means of the evaluation circuit, the admittance matrix of the two-port element at each frequency location is determined without connection members in a similar manner as in the calculation of the impedance of the one-port element.

During the measurement of the stray matrix of the two-port element, energy can be transmitted, especially in the case of a small distance between the connection members, not only through the two-port element, but also through the free space. Therefore, it is ensured that the evaluation circuit in the calculation of the admittance matrix additionally includes the parameters of the admittance matrix, which describes the coupling through free space between the connection members, the parameters having been determined before the actual measurement by a measurement of the stray matrix at each frequency location under no-load conditions of the connections of the two connection members. Therefore, before the actual measurement, a premeasurement of the stray matrix is carried out at each frequency location, which is obtained with open connections, i.e. in the absence of the two-port element.

Preferably, as optimization strategy a coordinate searching method is used, which can be effected in a simple manner by the evaluation circuit. It is then ensured that the evaluation circuit changes in order of succession all the initial values of the equivalent circuit diagram elements by a part of the value, calculates after the change of a value the admittance matrix of the two-port element or the impedance of the one-port element at each frequency location, compares the calculated result with the corrected measurement result, continues the change of the values of the equivalent circuit diagram elements until the deviation between the corrected measurement result and the calculated result cannot be further reduced, and supplies the last determined values of the equivalent circuit diagram elements.

When starting the optimization strategy, the evaluation circuit calculates, for example, from the initial values determined before the measurement the impedance of a one-port element and compares by means of an error function the deviation between the calculated result and the measurement result. Subsequently, the evaluation circuit changes the value of an equivalent circuit diagram by a part of the value (for example 5%) in positive direction. Thereafter, again the impedance of the one-port element is calculated. If a reduced deviation is obtained over the whole preselected frequency range, the evaluation circuit changes the value of another equivalent circuit diagram element. However, if no reduction takes place, a change by the same amount is effected in negative direction and again the deviation is determined. If a smaller deviation is obtained, the changed value is taken over instead of the old value. This strategy is continued with each equivalent circuit diagram element. When all the equivalent circuit diagram elements have been changed, so that a minimization of the deviation is obtained over the preselected frequency range, this procedure is started again and is repeated until no further reduction takes place. The last determined values of the equivalent circuit diagram elements then represent a determination on approximation of the values of the equivalent circuit diagram of the elements at high frequencies. In addition, the average quadratic error of the approximation can be determined and supplied.

In many cases, it is not possible to estimate before the measurement, which equivalent circuit diagram is most suitable for the element to be measured. Therefore, it is ensured that the evaluation circuit carries out the determination on approximation of the values for the equivalent circuit diagram elements for several equivalent circuit diagrams, and supplies the values of the equivalent circuit diagram elements for the tw-port element and the one-port element, respectively, at which the smallest deviation occurs between the measurement result and the calculated result.

In this case, the values are calculated for several equivalent circuit diagram elements by means of an optimization strategy. That equivalent circuit diagram is then supplied in which after the optimization the smallest deviation occurs between the calculated result and the measurement result.

BRIEF DESCRIPTION OF THE DRAWING

In order that the invention may be readily carried out, it will now be described more fully, by way of example, with reference to the accompanying drawings, in which.

DETAILED DESCRIPTION OF THE PREFERRED EMBODIMENTS

Figure 1:
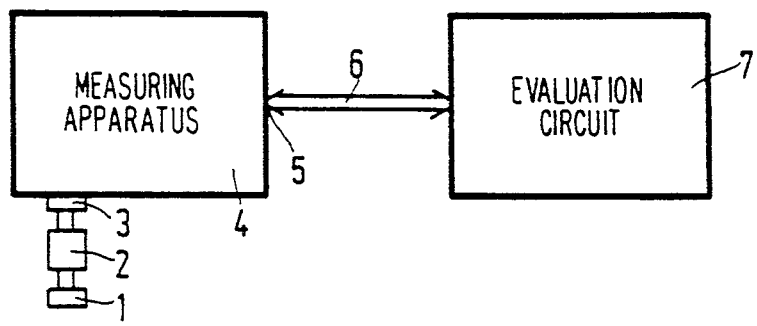
FIG. 1 shows an arrangement for determining on approximation the equivalent circuit diagram of a one-port element.

The arrangement shown in FIG. 1 serves to determine on approximation the equivalent circuit diagram of an element 1, which is connected through a connection member 2 to an input 3 of a measuring apparatus 4. The measuring apparatus 4 measures the real part and the imaginary part or the amplitude and the phase of the impedance of the measuring element constituted by the one-port element 1 and the connection member 2 at preselected frequency locations of a frequency range. The input 3 of the commercially available measuring device (for example Hewlett Packard HP 8542 A) is a standard input (N connector), to which the one-port element 1 is connected through a connection member 2 adapted to said standard input. Further, the measuring apparatus 4 has an output 5, at which the measured data can be read as digital sample values. The output 5 is connected to an evaluation circuit 7, which is constructed as a digital calculation arrangement. The evaluation circuit 7 comprises a central calculation unit, for example a microprocessor, at least one random access memory (RAM), at least one read-only memory (ROM), a writing element and a reading element. The evaluation circuit can be connected to further external memory circuits, for example a hard disk drive and a reading unit in the form of a display screen or of a printer. The values of the impedance determined by the measuring apparatus and the corresponding frequency locations are supplied through the lead 6 to the digital calculation arrangement 7.

Figure 2:
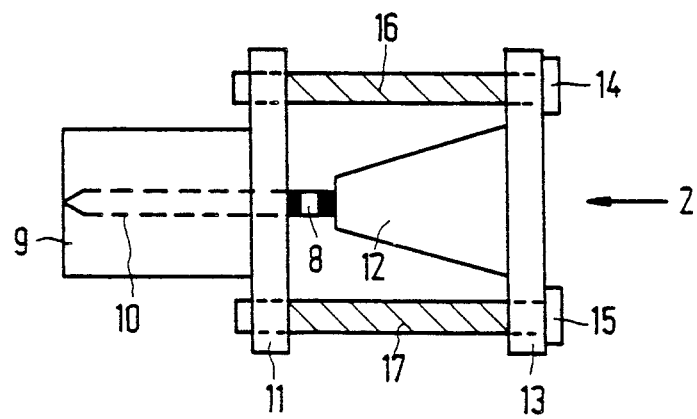
FIG. 2 shows a connection member, which connects the element to the measuring apparatus used in FIG. 1.

An example of a connection member 2, which connects an SMD resistor 8 to the input 3 of the measuring apparatus 4, is shown in FIG. 2. The input 3 of the measuring apparatus 4 consists of a circular tube provided with external screwthread and a tube arranged at the centre and having a smaller diameter. The connection member 2 comprises a tube provided with internal screwthread, which is screwed into the standard connection 3 and represents a first connection of the connection member 2. The second connection of the connection member 2 is arranged at the centre of the circular tube 9 and is in the form of a pin 10, which engages into the tube arranged at the centre of the tube of the input 3. The tube 9 and the pin 10 terminate in a plate 11, which consists, for example, of brass. A bore is provided at the centre of the plate 11, the pin 10 being fitted into this bore. The pin 10 is isolated from the plate 11 by an isolating layer. The part of the pin 10 held in the plate 11 serves as a first contact point for the SMD resistor 8. The other contact point of the quadrangular SMD resistor is connected to a wedge-shaped brass part 12, which terminates in a plate 13, which takes the form of a counterpart of the plate 11. The plates 11 and 13 each time have two bore holes. The bore holes of the plates 11 and 13 are adapted to receive two screws 14 and 15, which join the plates 11 and 13. Steel springs 16 and 17 are arranged between the plates 11 and 13 and around the screws 14 and 15, which springs exert a stress on the plates 11 and 13. The tube 9, which represents the other connection, is contacted with the second contact of the SMD element 8 through the brass part 12, the plate 13, the screws 14 and 15 and the plate 11.

After measurement of the impedance of the one-port element 1 with the connection member 2, values for the equivalent circuit diagram elements are calculated in the evaluation circuit 7 from the measured impedance values. During measurement, falsifications of the measurement result occur due to parasitic influences of the connection member 2. Therefore, before determining the values of the equivalent circuit diagram elements a correction of the measurement results must be effected. For this purpose, before the measurement, parameters of the admittance matrix for each frequency location have been fed into the evaluation circuit 7. It is also possible, as described hereinafter, to determine the parameters of the admittance matrix at each frequency location before the measurement by premeasurement. First a shortcircuit measurement is carried out at each frequency location and the determined measurement values are stored. Then a no-load measurement is carried out at each frequency location, whereupon a measurement is carried out, in which the connection member 2 is terminated by a standard resistor of about 50Ω. The standard resistor, which is known, has small, but not negligible inductive and capacitive components. The shortcircuit measurement is carried out by a metal part, which interconnects the connections of the connection member 2. Such a metal part also has a known inductive component and a small known frequency-dependent resistance. After the three measurements at each frequency location, the admittance matrix at each frequency location can be determined.

The admittance matrix is described by the parameters y11, y12, y21 and y22 for a two-port element and is defined by the two following equations:

$$i1 = y11\ u1 + y12\ u2 \tag{3}$$

$$i2 = y21\ u1 + y22\ u2 \tag{4}$$

Figure 3:
FIG. 3 shows a two-port circuit for explanation of the bipole parameters of the connection member.

FIG. 3 shows a two-port element with the voltages u1, u2, i1 and i2, which is characterized by the equations (3) and (4). The determinant det (Y) is given by the following equation:

$$det(Y) = y11\ y22 - y12\ y21 \tag{5}$$

For passive two-ports, the relation holds:

$$y12 = y21.$$

After the shortcircuit measurements, no-load measurements and measurements with standard resistor, at each frequency location the admittance matrix Y can be calculated from the three following equations:

$$det(Y) = \frac{Zm0 - Zm50}{Zm50\ Zd0\ Zmu - Zm50\ Zd0\ Zm0 + Zm0\ Zd50\ (Zm50 - Zmu)} \tag{6}$$

$$y22 = det(Y)\ Zmu. \tag{7}$$

$$y11 = \frac{1 - det(Y)\ Zd50\ (Zm50 - Zmu)}{Zm50} \tag{8}$$

where Zmu is the impedance of the connection member 2 under no-load conditions; Zd0 is the impedance of a metal part, which serves as shortcircuit termination and has a resistance of approximately 0Ω; ZmO is the impedance of the connection member 2 terminated by the metal part (shortcircuit); Zd50 is the impedance of the standard resistor, which is approximately 50Ω; Zm50 is the impedance of the connection member 2 with termination by the standard resistor. In practice, that is to say under real conditions, the standard resistor and the metal part serving as shortcircuit element have—as stated above—small parasitic components, which are not negligible, however, and must be taken into account in the calculation. The impedances of the brass plate and of the standard resistor are known. The impedance of the no-load element is assumed to be infinite.

The impedance Zd of the one-port element 1 can be determined from the following equation at each frequency location:

$$Zd = \frac{1 - y11\,Zm}{Zm\,det(Y) - y22} \qquad (9)$$

where Zm is the impedance of the connection member 2 terminated by the one-port element 1 to be measured.

After the evaluation circuit 7 has calculated the values for the impedance Zd at each frequency location for the one-port element 1, an optimization strategy is used to obtain the values for the equivalent circuit diagram elements. Before the measurement of the impedance of the SMD resistor 8 determined by means of the connection member 2, as an equivalent circuit diagram a circuit comprising a parallel-combination of a resistor R and a capacitor C and a coil L connected in series therewith was chosen. By means of the flow chart in FIG. 4, it is explained how the evaluation circuit 7 determines on approximation the values of the equivalent circuit diagram elements.

The impedance Zd of the one-port element 1 has been measured as real part and imaginary part. As initial values for the resistor R, the average value of the real part of the impedance is chosen. For the capacitance C and for the inductance L, initial values have been indicated before the measurement.

Figure 4:
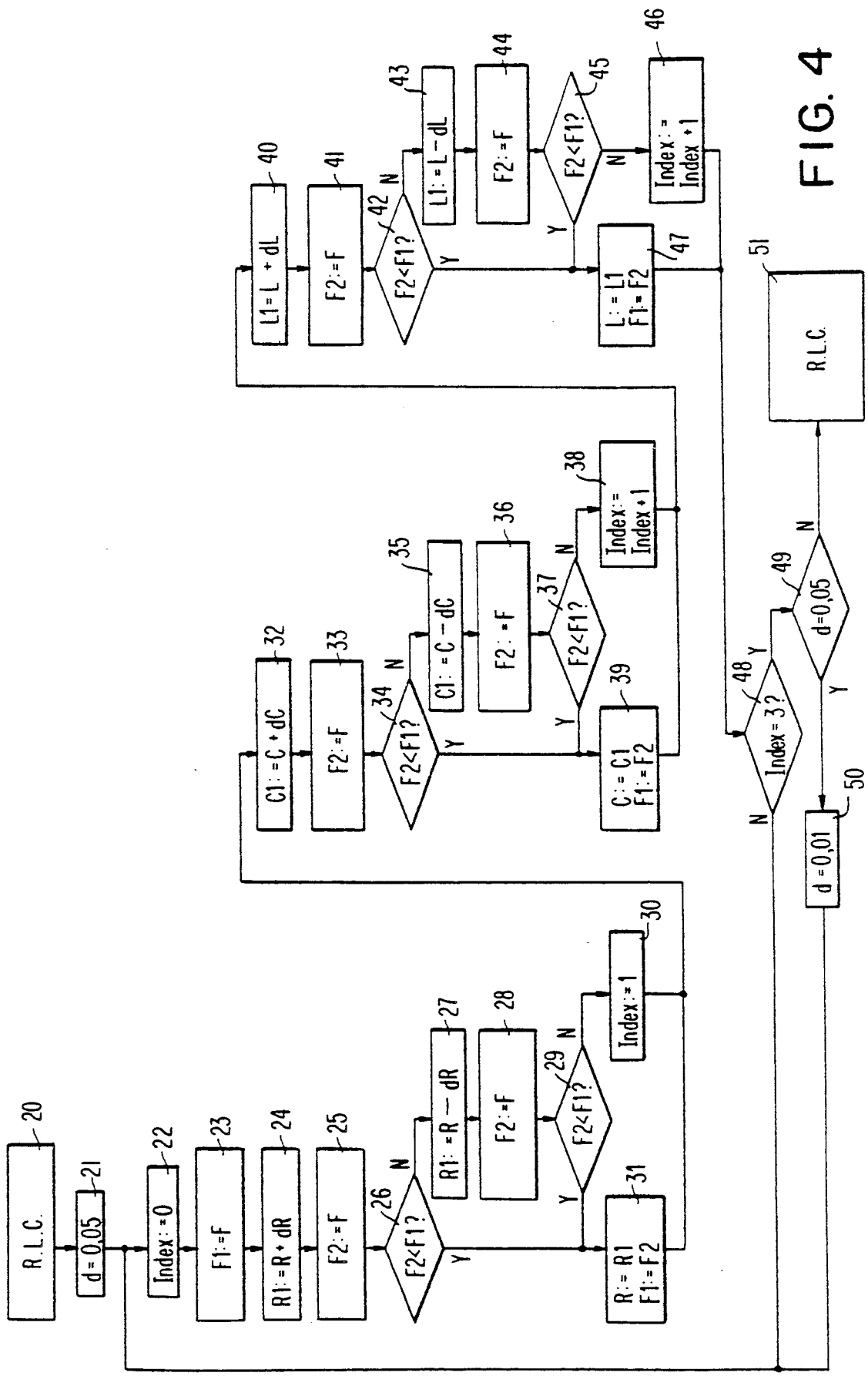
FIG. 4 shows a flow chart, which illustrates the calculation of the equivalent circuit diagram elements in the evaluation circuit shown in FIG. 1.

FIG. 4 shows the definition of the initial values in the block 20. In the next program step (block 21), the change of the elements first to be carried out is defined with d=0.05, i.e. a deviation of 5%. First the variable "index" is made equal to zero (block 22), while for the values of the resistance R, of the coil L and of the capacitance C, the impedance of the equivalent circuit diagram at the preselected frequency locations is calculated and an error function F is calculated (block 23). By means of the error function F, a deviation between the calculated impedance and the measured impedance at the frequency locations is ascertained. The error function F is described by the following equation:

$$F = \left[ \frac{\sum_{i=1}^{m} \left[ \frac{x(fi) - y(fi)}{x(fi)} \right]^2}{m} \right]^{\frac{1}{2}} \qquad (10)$$

where x(fi) is the measured impedance, y(fi) is the calculated impedance at the frequency location fi and m is the number of frequency locations. As described in block 24, a resistance dR is then added to the resistance value R and a new resistance R1 appears. By means of this resistance R1, again the impedance and then the error function is calculated (block 25). The last calculated error function F is defined as function F2. Subsequently, a comparison (block 26) takes place between the error function F1 calculated in the block 23 and the error function F2. If the error function F2 is not smaller than the error function F1, the deviation between the calculated impedance and the measured impedance has not become smaller. Therefore, as represented in block 27, the resistance R is reduced by the resistance dR. By means of the new resistance R1 thus obtained, again the impedance and the error function F are calculated. The error function F is made equal to F2 (block 28) and again a comparison (block 29) takes place between the error function F2 and the error function F1. If the error function F2 is not smaller than the error function F1, no minimization is obtained and in the block 30 the variable "index" is made equal to 1. If the deviation between the calculated result and the measurement result has become smaller—by a minimization either in positive direction (block 24) or in negative direction (block 27)—the changed resistance value R1 is made equal to the resistance value R and the error function F2 is made equal to the error function F1 (block 31) because a reduced deviation with respect to the new resistance value R1 was obtained.

In the next program steps, a change of the capacitance C was effected and attempts are made to attain a reduced deviation. First, as shown in block 32, the capacitance C is increased by a value dC. A capacitance C1 is obtained. Subsequently, the impedance and the error function F are calculated, which error function is then made equal to F2 (block 33). In the block 34, the comparison between the error function F1 and the last calculated error function F2 is represented. If it is ascertained that the error function F2 is not smaller than the error function F1, the capacitance C is reduced by the capacitance dC and a new capacitance C1 is obtained (block 35). Subsequently, the new impedance and an error function are calculated, which error function ia made equal to F2 (block 36). As is represented in the block 37, the comparison between the error function F2 and the error function F1 is then carried out. If also in this case it is found that the error function F2 is not smaller than the error function F1, as shown in block 37, the variable "index" is increased by 1. In case, however, the error function F2 in block 34 or in block 37 is smaller than the error function F1, the calculated capacitance C1 is made equal to the capacitance C and the last calculated error function F2 is made equal to the error function F1.

The change of the inductance L in the subsequent program steps is carried out in the same manner in which the capacitance C and the resistance R are changed. First, as shown in block 40, the inductance L is increased by an amount dL so that an inductance L1 is obtained. Block 41 shows the calculation of the impedance and the calculation of the error function F, which is now made equal to F2. In the subsequent comparison (block 42), again the error function F1 is compared with the error function F2 calculated anew. If it appears that the error function F2 is not smaller than the error function F1, as shown in block 43, the inductance L is reduced by the inductance dL. By means of the inductance L1 thus calculated, a new impedance and then a new error function F is calculated, which is made equal to F2 (block 44). As shown in block 45, the comparison between the error function F2 calculated anew and the error function F1 is then carried out. If the error function F2 is not smaller than the error function F1, the variable "index" is increased by 1 (block 46). If during the comparison of the error functions in block 42 or in block 45 it is ascertained that the error function F2 is smaller than the error function F1, as shown in block 47, the inductance L1 calculated anew is made equal to the inductance L and the last calculated error function F2 is made equal to the error function F1.

After calculation of the inductance, it is then checked in block 48 whether the variable "index" is equal to 3. If the variable "index" is equal to 3, no reduced deviation appeared in the resistance, capacitance and inductance calculation. In this case, the variable d is reduced to the value 0.01, as appears from the blocks 49 and 50, which corresponds to a variation of 1%. However, in case the calculation has already been carried out with this value d=0.01, the last calculated resistance, capacitance and inductance values are read out, as shown in block 51. These values then represent the approximation values for the equivalent circuit diagram elements. In case it has been ascertained in block 48 that the variable "index" is not equal to 3, the program step in block 22 is carried out. Likewise, if the variable d is not yet equal to 0.01, a calculation from block 22 is then carried out.

In many cases, it is not possible to indicate before the measurement, which equivalent circuit diagram is most suitable for the element to be measured. Therefore, the program, which is carried out in the evaluation circuit 7, can be changed over so that several equivalent circuit diagrams are calculated and that equivalent circuit diagram is used for the measured element which exhibits the smallest deviation between the measured and calculated values.

Figure 5:
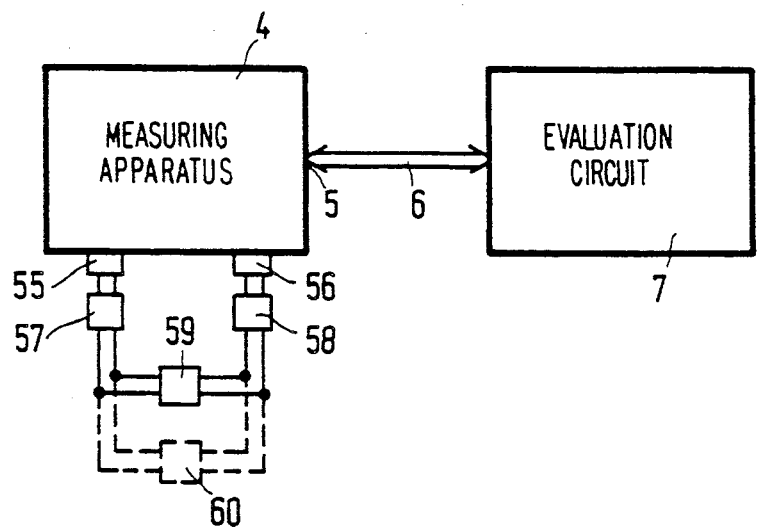
FIG. 5 shows an arrangement for determining on approximation the equivalent circuit diagram of a two-port element

FIG. 5 shows an arrangement for determining on approximation the equivalent circuit diagram of a two-port element 59 at high frequencies. This arrangement also comprises the measuring apparatus 4 and the evaluation circuit 7. The measuring apparatus 4 and the evaluation circuit 7 are connected to each other through the lead 6. The measuring apparatus has two inputs 55 and 56, to which each time a connection member 57 and 58 is connected. The two-port element 59 to be measured is connected to the other ports of the connection members 57 and 58. The measuring apparatus 4 measures the stray matrix of the two two-port elements 57 and 58 and of the two-port element 59 at the preselected frequency locations. In order to obtain the stray matrix at the preselected frequency locations for the two-port element 59, also a correction of the measurement results must be effected. For each connection member 57 and 58, a shortcircuit measurement, a no-load measurement and a measurement with a standard resistor are carried out at each frequency location.

Further, a measurement of the stray matrix must be carried out in the absence of a two-port element between the ports of the connection members 57 and 58, which are normally connected to the two-port element to be measured. Between the connection members, especially with small distances, an energy exchange occurs not only through the two-port element 59, but also through the space surrounding the two-port element 59 (fictitious connection member 60). After calculation of the stray matrix of the whole chain, i.e. of the connection members 57 and 58 and of the fictitious connection member 60 arranged parallel to the two-port element 59, an admittance matrix is calculated from the determined stray matrix at each frequency location. The admittance matrix for the fictive connection member 60 can now be determined by the following method. From the overall admittance matrix of the connection members 57, 58 and 60 and the admittance matrix of one connection member, for example 57, the admittance matrix of the connection members 58 and 60 at a frequency location can be determined. Subsequently, the admittance matrix of the fictive connection member 60 is determined. From the overall admittance matrix of the connection members 58 and 60 and the admittance matrix of the connection member 58, the admittance matrix of the fictive connection member 60 is calculated. The individual admittance matrices at each frequency location for the connection members 57, 58 and 60 are stored in the evaluation circuit 7. After measurement of the stray matrix of the two-port element 59 with the connection members 57, 58 and 60, a correction calculation is carried out, which determines the admittance matrix at each frequency location of the two-port element 59. Subsequently, an optimization strategy for determining the values of the equivalent circuit diagram elements can be carried out. This calculation is carried out in the same manner as shown in FIG. 4.

We claim:

1. An arrangement for determining, on approximation, element values of an equivalent circuit diagram of a discrete electrical component to be measured, said arrangement comprising a measuring apparatus (4) having connection member(s) (2; 57; 58) for electrically connecting the electrical component to be measured to said measuring apparatus, which component to be measured is either a two-port element (59) or a one-port element (1), said measurement apparatus being configured for measuring over a preselected frequency range measurement result values of the component to be measured in combination with the connection member(s), said measurement result values comprising parameters of a stray matrix when the component to be measured is a two-port element, or an impedance or reflection factor when the element to be measured is a one-port element, and an evaluation circuit (7) connected to the measuring apparatus (4) and which comprises programmed means configured for forming corrected measurement result values from said actual measurement result values and two-port parameters of the connection member(s) (2; 57, 58) predetermined before utilizing said connection member(s) to electrically connect the component to be measured to the measurement apparatus, and for determining values of elements for an equivalent circuit diagram of the component to be measured (1, 59) from the corrected measurement result values in a manner in which a deviation between said corrected measurement result and a result calculated from the determined values of the elements of the equivalent circuit diagram is substantially minimized.

2. An arrangement as claimed in claim 1, wherein when the component to be measured is a one-port element (1) for connection to said measuring apparatus (4) through said connection member (2), the predetermined two-port parameters of said connection member are parameters of an admittance matrix, and the programmed means of the evaluation circuit (7) is configured to form said corrected measurement result values from the measurement result values and the parameters of the admittance matrix of said connection member (2) for each preselected frequency location, the parameters of the admittance matrix having been predetermined for each preselected frequency location by a series of measurements with said connection member (2) sequentially under a shortcircuit condition, under a no-load condition, and when connected to a standard resistor.

3. An arrangement as claimed in claim 1, wherein when the component to be measured is a two-port element (59) for connection to said measuring apparatus (4) through a pair of said connection elements (57, 58), the two-port parameters of said pair of connection members (57, 58) are parameters of respective admittance matrices, and the programmed means of the evaluation circuit (7) is configured to form said corrected measurement result values from the measurement result values and the parameters of the respective admittance matrices of said pair of connection members (57, 58) for each preselected frequency location, said parameters of the respective admittance matrices of the pair of connection members (57, 58) having been predetermined for each preselected frequency location by a series of measurements with a respective one of said pair of connection members (57, 58) sequentially under a shortcircuit condition, under a no-load condition, and when connected to a standard resistor.

4. An arrangement as claimed in claim 3, wherein a fictitious coupling member (60) is assumed to describe a coupling through free space between said pair of coupling members (57, 58), and the programmed means of the evaluation circuit (7) is further configured to utilize the parameters of a matrix describing said fictitious coupling member (60) in said forming of said corrected measurement result values, said parameters of said matrix describing said fictitious coupling member (60) having been predetermined before utilizing said pair of connection members (57, 58) to electrically connect said two-port element (59) to said measuring apparatus (4) by a measurement of a stray matrix at each frequency location with both said pair of connection members (57, 58) under no-load conditions.

5. An arrangement as claimed in claim 1, wherein the programmed means of the evaluation circuit (7) is configured to determine said values of the elements of said equivalent circuit diagram as follows:
   initially setting the values of the elements of an equivalent circuit diagram to initial values,
   changing each value of the elements of said equivalent circuit diagram by a part of said value in an order of succession among said equivalent circuit elements,
   after said changing of each value calculating at each frequency location an admittance matrix of the component to be measured when it is a two-port element (59) or an impedance of the element to be measured when it is a one-port element (1) to form a calculated result,
   comparing the calculated result with the corrected measurement result to form a deviation,
   continuing said changing of the values of the elements of the equivalent circuit diagram until the deviation between the corrected measurement result and the calculated result is substantially minimized, and
   supplying as the determined values the values of the elements of the equivalent circuit diagram resulting from the last changing of each value.

6. An arrangement as claimed in claim 2, wherein said arrangement is for selecting an equivalent circuit diagram from a plurality of candidate equivalent circuit diagrams and determining, on approximation, the values of the elements thereof and wherein said determining by the programmed means of the evaluation circuit (7) is by determining the values of the elements for each of said candidate equivalent circuit diagrams, and selecting the equivalent circuit diagram from among the candidate equivalent circuit diagrams for which the deviation between the measurement result and the result calculated from the determined values of the elements of said equivalent circuit is the smallest.

7. An arrangement as claimed in claim 2, wherein the programmed means of the evaluation circuit (7) is configured to determine said values of the elements of said equivalent circuit diagram as follows:
   initially setting the values of the elements of an equivalent circuit diagram to initial values,
   changing each value of the elements of said equivalent circuit diagram by a part of said value in an order of succession among said elements,
   after said changing of each value calculating at each frequency location an impedance of the element to be measured when it is a one-port element (1) to form a calculated result,
   comparing the calculated result with the corrected measurement result to form a deviation,
   continuing said changing of the values of the elements of the equivalent circuit diagram until the deviation between the corrected measurement result and the calculated result is substantially minimized, and
   supplying as the determined values the values of the elements of the equivalent circuit diagram resulting from the last changing of each value.

8. An arrangement as claimed in claim 3, wherein the programmed means of the evaluation circuit (7) is configured to determine said values of the elements of said equivalent circuit diagram as follows:
   initially setting the values of the elements of an equivalent circuit diagram to initial values,
   changing each value of the elements of said equivalent circuit diagram by a part of said value in an order of succession among said elements,
   after said changing of each value calculating at each frequency location an admittance matrix of the element to be measured when it is a two-port element (59) to form a calculated result,
   comparing the calculated result with the corrected measurement result to form a deviation,
   continuing said changing of the values of the elements of the equivalent circuit diagram until the deviation between the corrected measurement result and the calculated result is substantially minimized, and
   supplying as the determined values the values of the elements of the equivalent circuit diagram resulting from the last changing of each value.

* * * * *